(12) United States Patent
Kim

(10) Patent No.: US 8,151,222 B2
(45) Date of Patent: Apr. 3, 2012

(54) METHOD FOR DECOMPOSING DESIGNED PATTERN LAYOUT AND METHOD FOR FABRICATING EXPOSURE MASK USING THE SAME

(75) Inventor: Cheol Kyun Kim, Icheon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 581 days.

(21) Appl. No.: 12/326,296

(22) Filed: Dec. 2, 2008

(65) Prior Publication Data

US 2010/0017779 A1   Jan. 21, 2010

(30) Foreign Application Priority Data

Jul. 17, 2008   (KR) .................. 10-2008-0069614

(51) Int. Cl.
  *G06F 17/50*   (2006.01)
(52) U.S. Cl. .............. 716/54; 716/50; 716/51; 716/52; 716/53; 716/55; 716/118; 716/119; 716/126; 716/139; 430/5; 430/30

(58) Field of Classification Search .............. 716/50–55, 716/105, 118–119, 126, 139; 430/5, 30
See application file for complete search history.

(56) References Cited

U.S. PATENT DOCUMENTS

| | | | |
|---|---|---|---|
| 6,238,824 B1 * | 5/2001 | Futrell et al. ................. | 430/5 |
| 6,316,163 B1 * | 11/2001 | Magoshi et al. .............. | 430/296 |
| 6,562,525 B2 | 5/2003 | Mori ............................. | 430/5 |
| 6,664,483 B2 * | 12/2003 | Chong et al. ................. | 174/261 |
| 7,346,885 B2 | 3/2008 | Semmler ....................... | 716/19 |

FOREIGN PATENT DOCUMENTS

KR   10-2007-0075765   7/2007

* cited by examiner

*Primary Examiner* — Nghia Doan
(74) *Attorney, Agent, or Firm* — Marshall, Gerstein & Borun LLP

(57) ABSTRACT

A method for decomposing a designed pattern layout and a method for fabricating an exposure mask using the same. After the designed pattern layout is automatically decomposed to obtain a plurality of mask layouts, a problematic region is determined through simulation of the mask layout, and fed back to correct the designed pattern layout. As a result, problems can be detected in each process and corrected to reduce the process time.

4 Claims, 10 Drawing Sheets

METHOD FOR DECOMPOSING DESIGNED PATTERN LAYOUT AND METHOD FOR FABRICATING EXPOSURE MASK USING THE SAME

CROSS-REFERENCE TO RELATED APPLICATION

Priority to Korean patent application number 10-2008-0069614, filed on Jul. 17, 2008, the entire disclosure of which is incorporated herein by reference, is claimed.

BACKGROUND OF THE INVENTION

The disclosure relates to a method for decomposing a designed pattern layout and a method for fabricating an exposure mask using the same.

Due to high degree of integration of semiconductor devices, the size and pitch of patterns included in a semiconductor device have decreased.

A spacer patterning technology (SPT) using three exposure masks has been suggested in order to obtain a highly-integrated, fine pattern even with conventional equipment.

In order to overcome the resolution limit of optical lithography, the SPT method includes a mask process and an etching process which are repeated several times. The manufacturing of devices using the SPT method includes forming a layout through a design flow which has been previously used by a designer, and decomposing the layout into a plurality of mask layouts by hand.

The mask layouts are applied to an actual process to identify problems. The problems are then corrected to form a final mask layout.

It is difficult to identify whether a pattern intended by a designer is formed over a wafer in the above-described conventional art. In other words, it is difficult to determine where problems occur before confirmation of a result of a pattern formed over a wafer.

Since patterns are divided manually in a pattern decomposing process, it takes a large amount of time, and it is possible to generate errors in the pattern decomposing process. Also, due to many process steps, it is difficult to obtain feedback in a short time.

BRIEF SUMMARY OF THE INVENTION

Various embodiments of the disclosure are directed at providing a method for decomposing a designed pattern layout and a method for fabricating an exposure mask using the same.

According to one embodiment of the disclosure, a method for decomposing a designed pattern layout that includes a plurality of line patterns and pad patterns overlapped with the line patterns comprises: decomposing a first mask layout having a first pattern defined between two neighboring line patterns, and a connection portion for connecting end portions of the two neighboring line patterns; decomposing a second mask layout having a second pattern that defines the pad pattern; and decomposing a third mask layout having a third pattern that opens the connection portion.

According to another embodiment of the disclosure, a method for fabricating an exposure mask comprises: decomposing a designed pattern layout that includes a plurality of line patterns and pad patterns overlapped with the line patterns into a plurality of mask layouts; verifying the mask layouts; combining the mask layouts to perform a simulation to obtain a simulated image; and comparing the simulated image with the designed pattern layout.

DESCRIPTION OF SPECIFIC EMBODIMENTS

Figure 1:
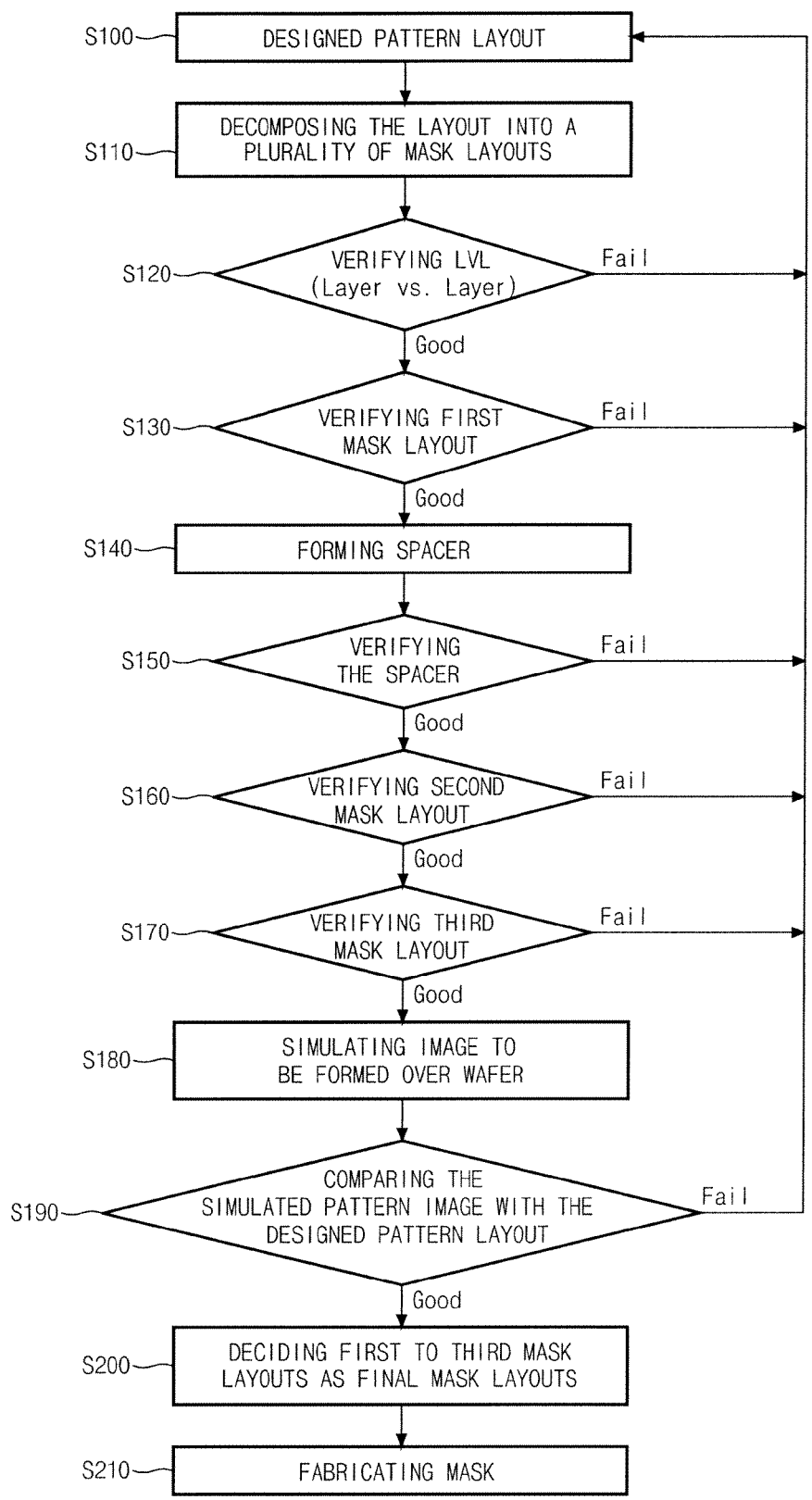
FIG. 1 is a flow chart illustrating a method for decomposing a designed pattern layout according to an embodiment of the disclosure.

The method depicted in the flow chart of FIG. 1 is described below with reference to FIGS. 2-4.

Figure 2A:
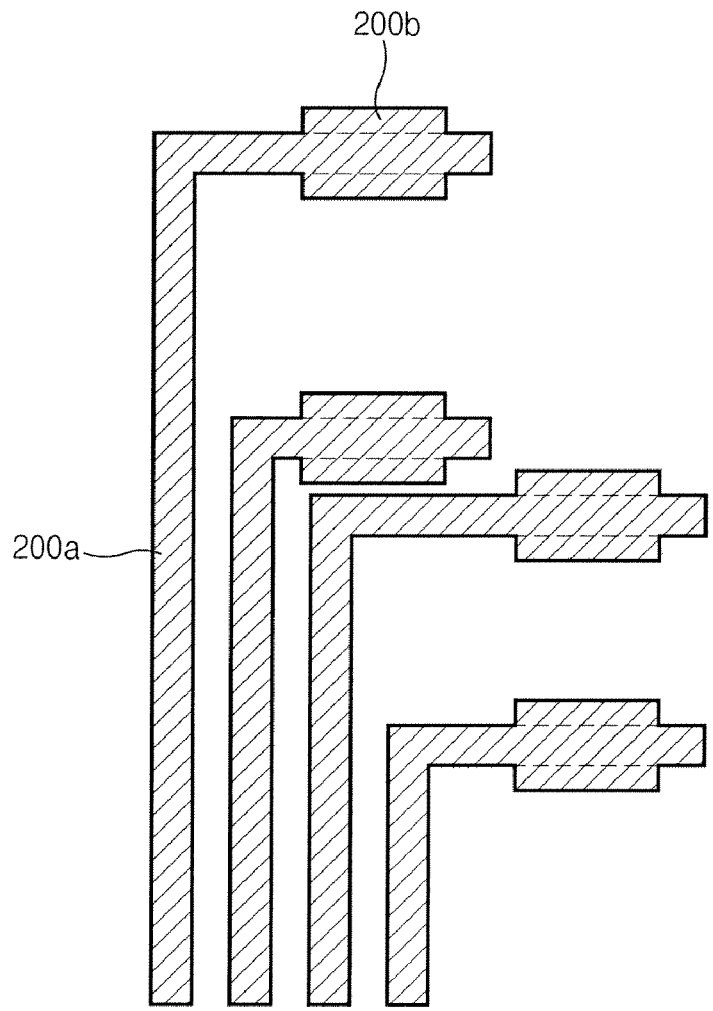
FIGS. 2a and 2b are diagrams illustrating a designed pattern layout according to an embodiment of the disclosure.

As shown in FIG. 2a, a designer designs a pattern layout using a design tool.

The disclosure is based on the designed pattern layout of FIG. 2a.

The designed pattern layout of FIG. 2a comprises a plurality of line patterns 200a and pad patterns 200b overlapped with the line patterns 200a.

The line pattern 200a is formed to have one bent side in the shape of the letter 'L'. One pad pattern 200b is located in one line pattern 200a.

The pad pattern 200b is overlaps with a short portion of the 'L'-shaped line pattern 200a.

The designed pattern layout may be obtained by forming a library of previously-defined reference patterns according to a specific design rule and combining desired patterns if necessary.

Figure 2B:
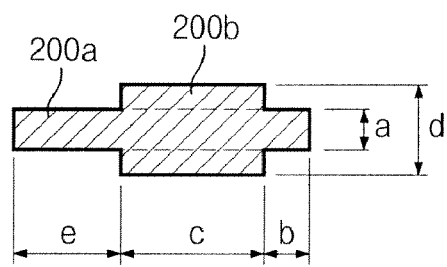

If the pad pattern 200b of FIG. 2b is selected from the reference patterns, a critical dimension (CD) (a) of the line pattern 200a overlapping the pad pattern 200b, a major axis CD (c) of the pad pattern 200b, a minor axis CD (d) of the pad pattern 200b, and overlay margins (b, e) between the line pattern 200a and the pad pattern 200b are previously defined. A designer can select a pattern having desired CD values.

After the design of the designed pattern layout is finished, a process is carried out to decompose the designed pattern layout of FIG. 2a into three mask layouts in order to check problematic parts in each mask layout step in the patterning process using a spacer patterning technology (SPT) method (S110).

The mask layout decomposing process is described in detail with reference to FIGS. 3a to 3c.

Figure 3A:
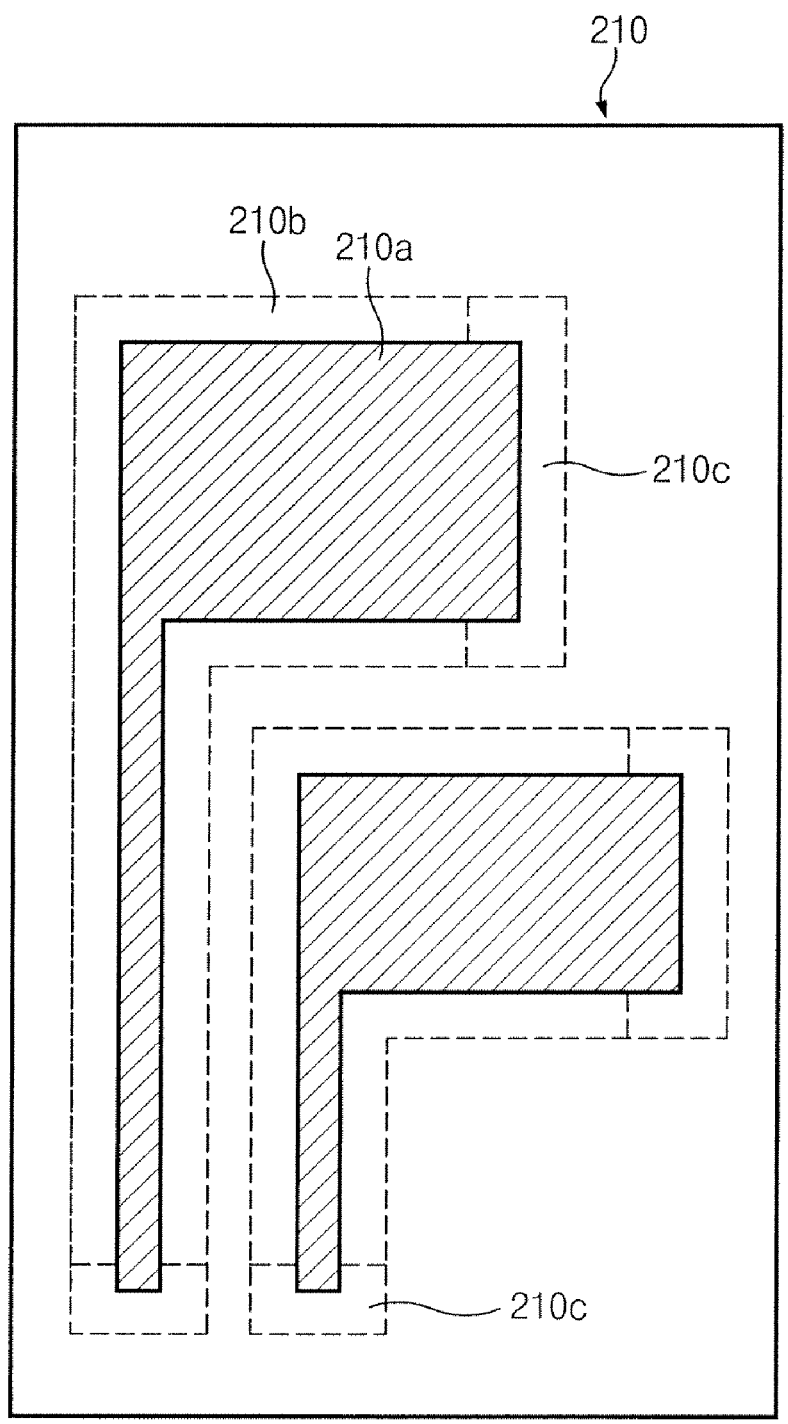
FIGS. 3a to 3c are diagrams illustrating a decomposed mask layout according to an embodiment of the disclosure.

In order to form the layout of FIG. 3a, end portions of two neighboring line patterns 210b which are aligned toward a minor axis direction of the line pattern 210b in the layout of FIG. 2 are connected to form connection portions 210c. The connection portions 210c include the two neighboring line patterns 210b with a ratio of 1:1. A CD of the connection portion 210c is the same as that of the line pattern 210b.

It is possible to decompose a first mask layout 210 including two neighboring first patterns 210a defined between the line pattern 210bs including the connection portion 210c.

Figure 3B:
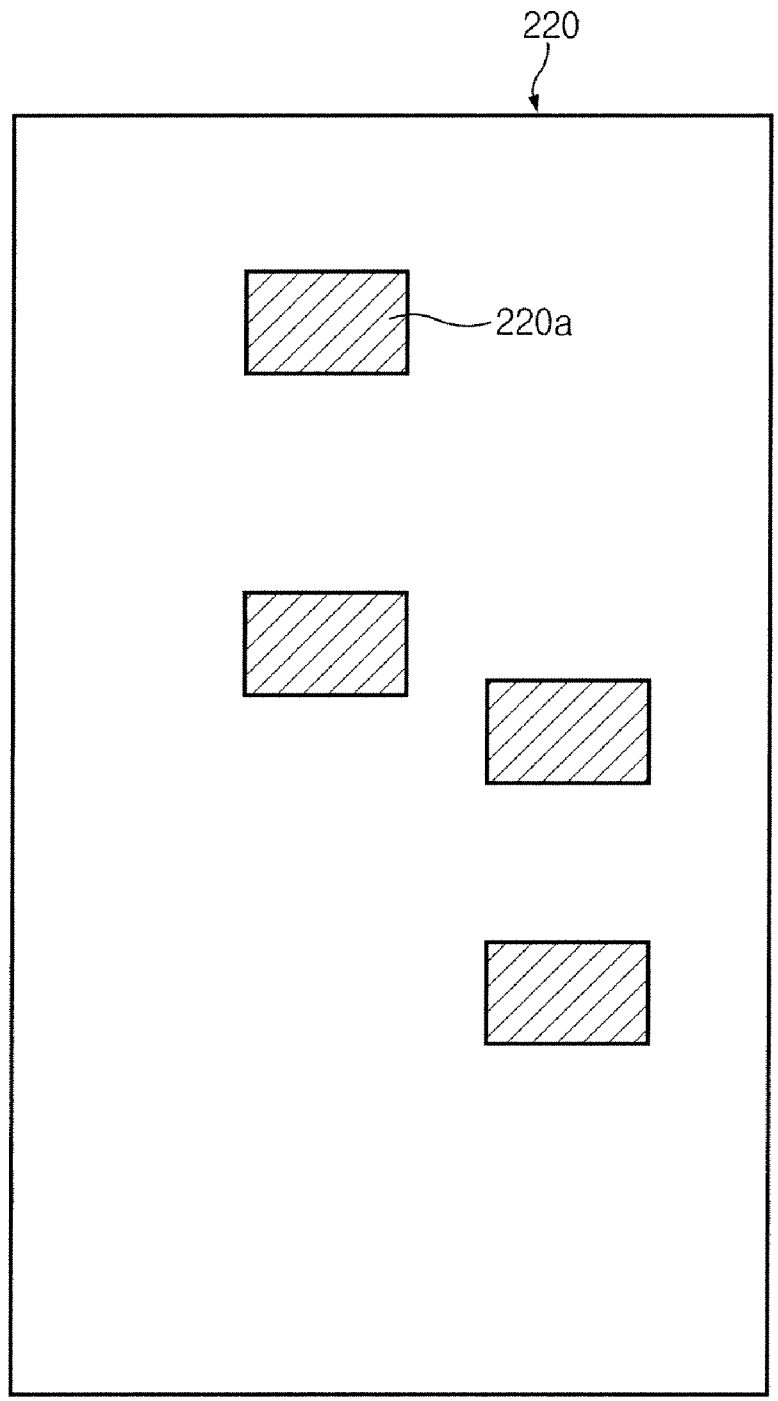

Referring to FIG. 3b, a second mask layout 220 including a second pattern 220a that defines the pad pattern 200b is decomposed.

Figure 3C:
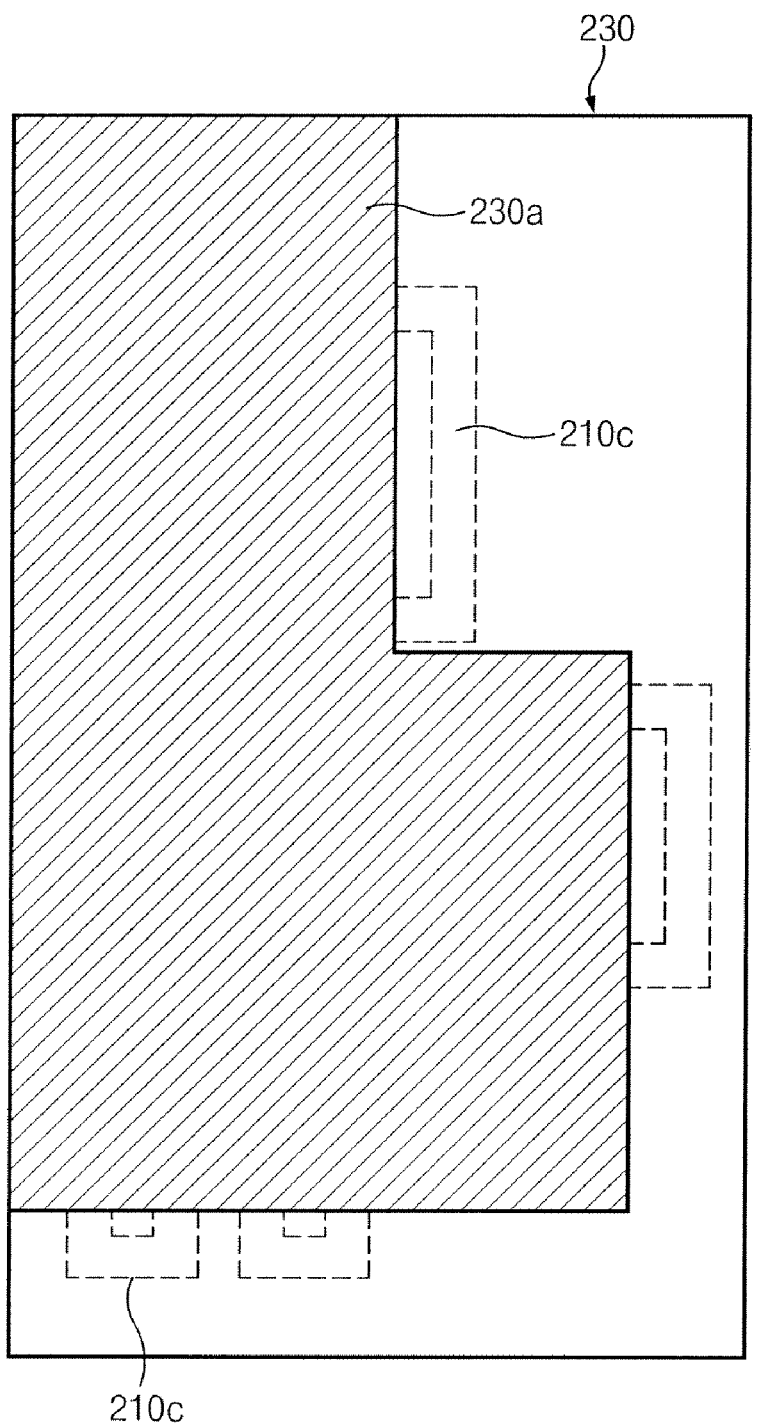

Referring to FIG. 3c, a third mask layout 230 including a third pattern 230a to open the connection portion 210c is decomposed.

After the three mask layouts shown in FIGS. 3a, 3b, and 3c are combined, Layer vs. Layer (LVL) verification of comparing the combined layout with the designed pattern layout of FIG. 2a is performed (S120).

The LVL verification is performed to confirm whether the combination of the mask layouts decomposed by the above-described process is identical with the pattern intended by a designer.

When the layout of the combined mask layouts is not identical with the designed pattern layout in the LVL verification step, or deviates from an acceptable error range, the designed pattern layout is re-designed.

However, when the layout of the mask layouts combined in the LVL verification is identical with the designed pattern layout or within an acceptable error range, the first mask layout 210 is verified (S130).

Figure 4A:
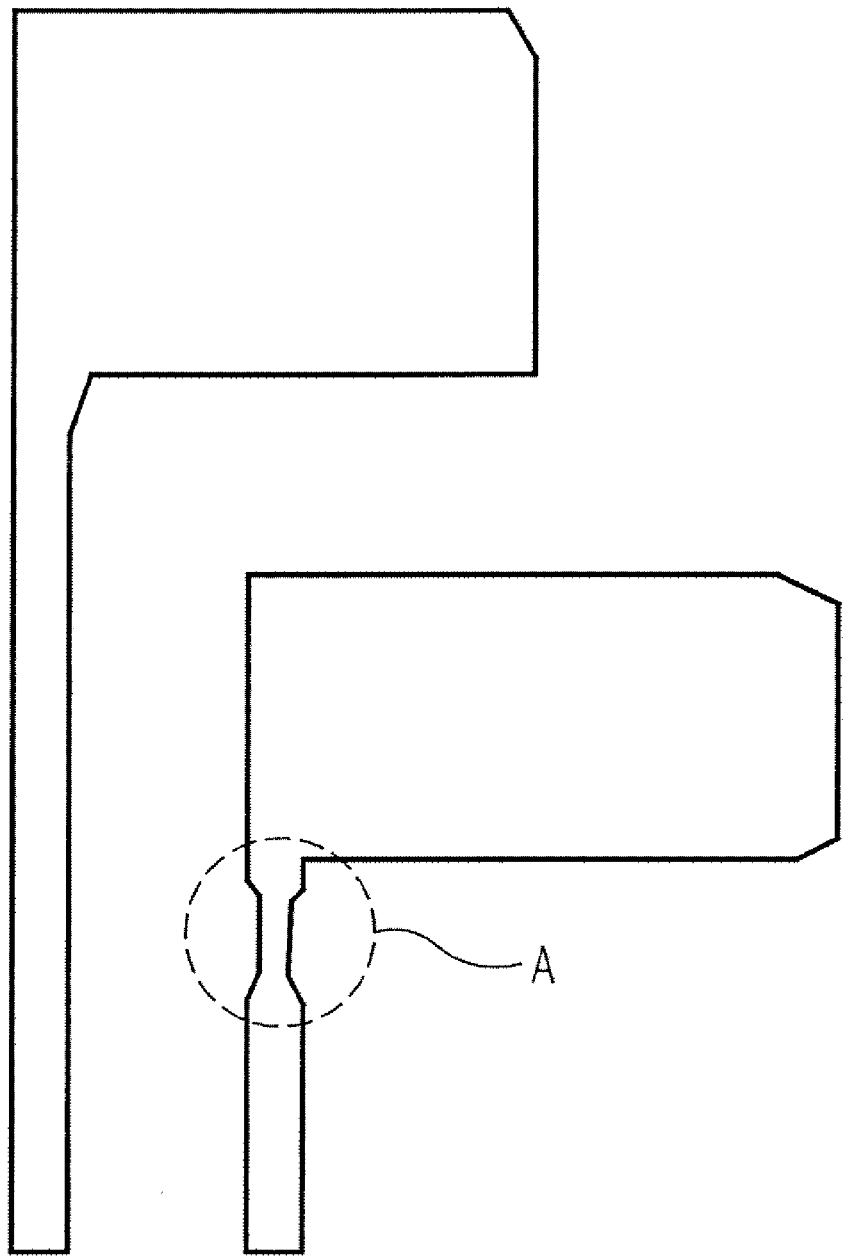
FIGS. 4a to 4e are plan diagrams illustrating problems generated when the disclosed mask layout is verified.

In the step of verifying the first mask layout 210, a simulation is performed with the first mask layout 210 to examine whether a bridge phenomenon or a pinch phenomenon where a pattern becomes thinner depending on a process variable of an exposure process as shown in 'A' of FIG. 4a.

When the pinch phenomenon or the bridge phenomenon occurs in verifying the first mask layout 210, the designed pattern layout is re-designed.

However, a spacer is formed (S140) if the pinch phenomenon or the bridge phenomenon does not occur in verifying the first mask layout 210.

After a contour image is formed with the first mask layout 210 passing through the step S130, the spacer is formed over the contour image.

After the formation of the spacer is finished, the spacer is verified (S150). The verification (S150) of the spacer includes examining whether the spacer is deposited with a uniform CD ('a' of FIG. 2b).

Figure 4B:
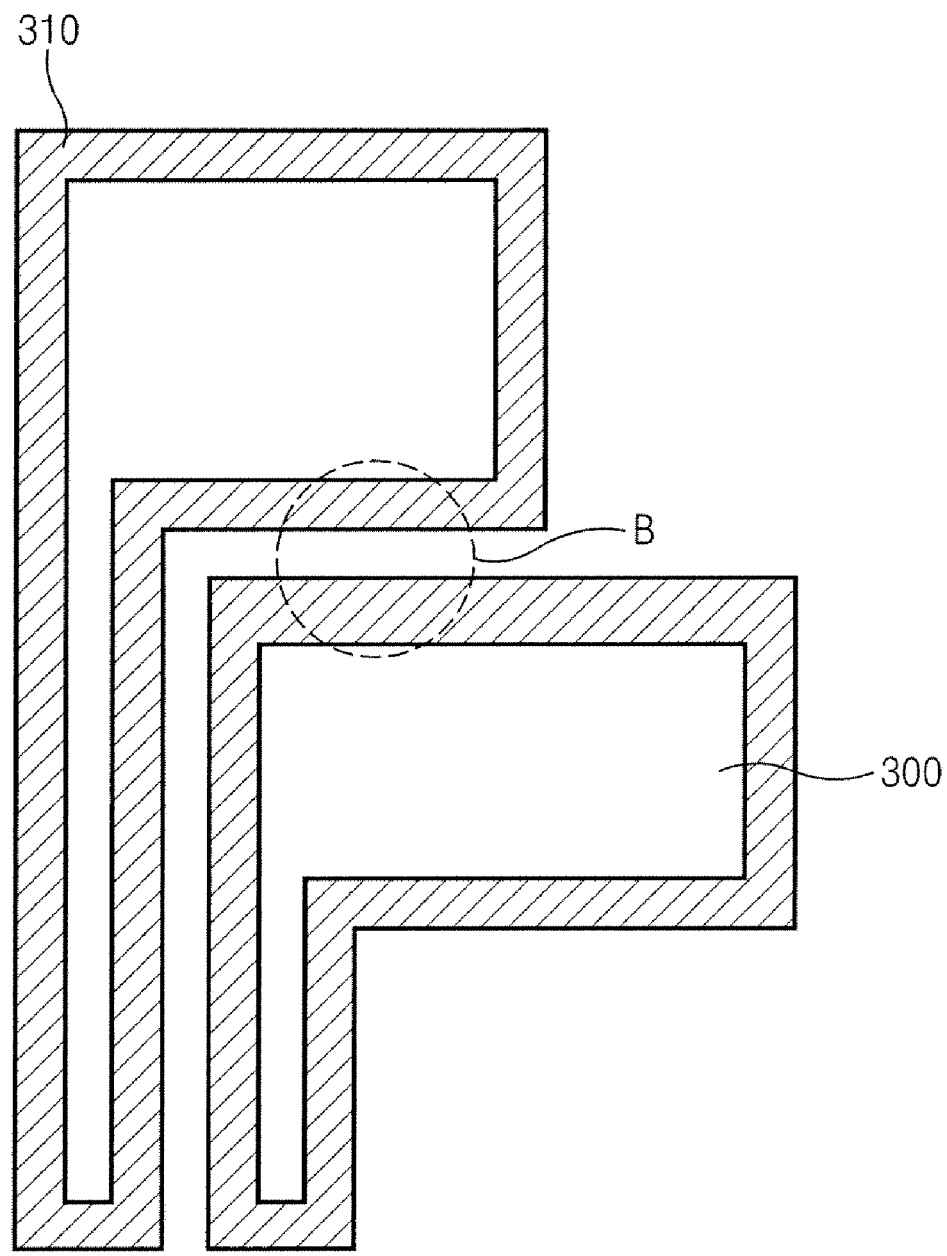

As shown in 'B' of FIG. 4b, when the spacer is not deposited with a uniform CD and a weak point is generated, the designed pattern layout is re-designed. When the spacer is deposited with a uniform CD, the second mask layout is verified (S160).

The verification of the second mask layout (S160) includes examining the respective CDs of the major axis and the minor axis of the second pattern 220a of FIG. 3b, and verifying an overlap margin of the first mask layout 210 and the second mask layout 220.

After a problematic region resulting from a design rule is extracted, the region is partially simulated. Off-setting and pad-sizing processes are performed on the problematic region.

Figure 4C:
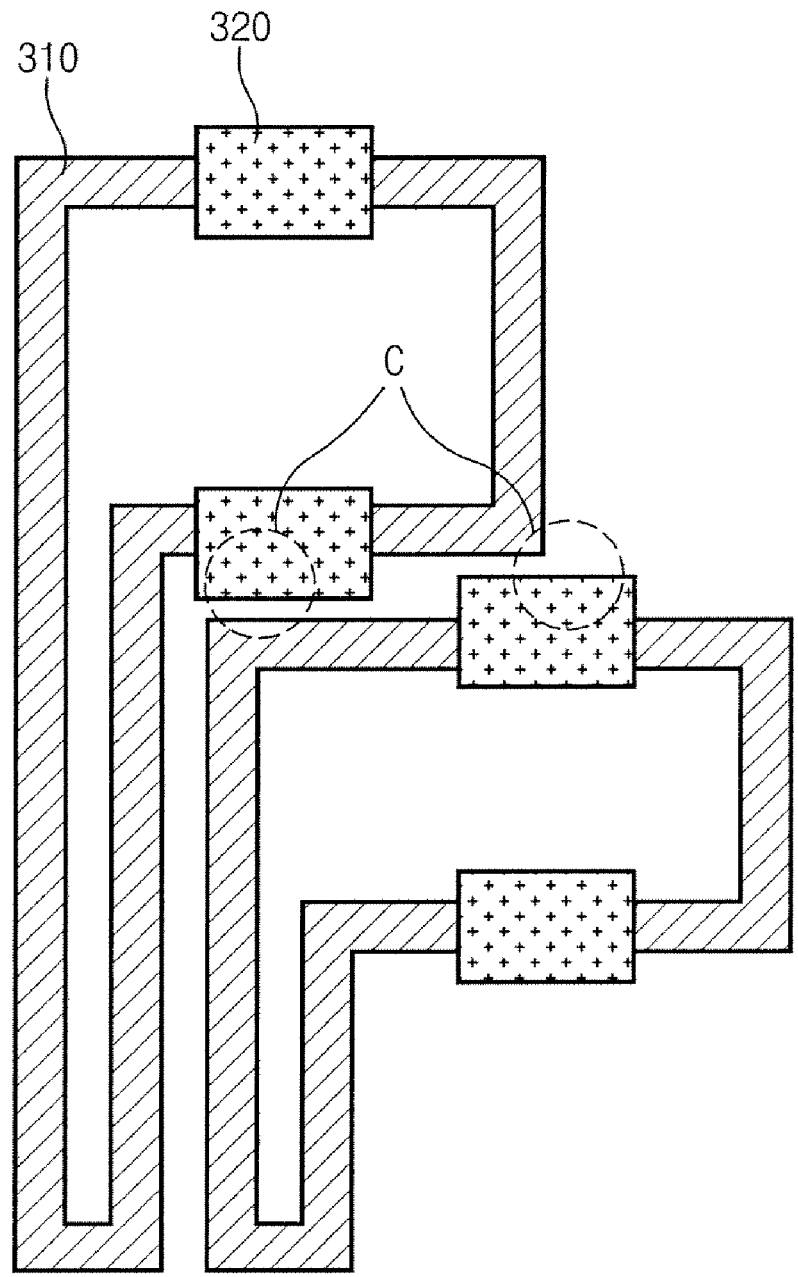
Figure 4D:
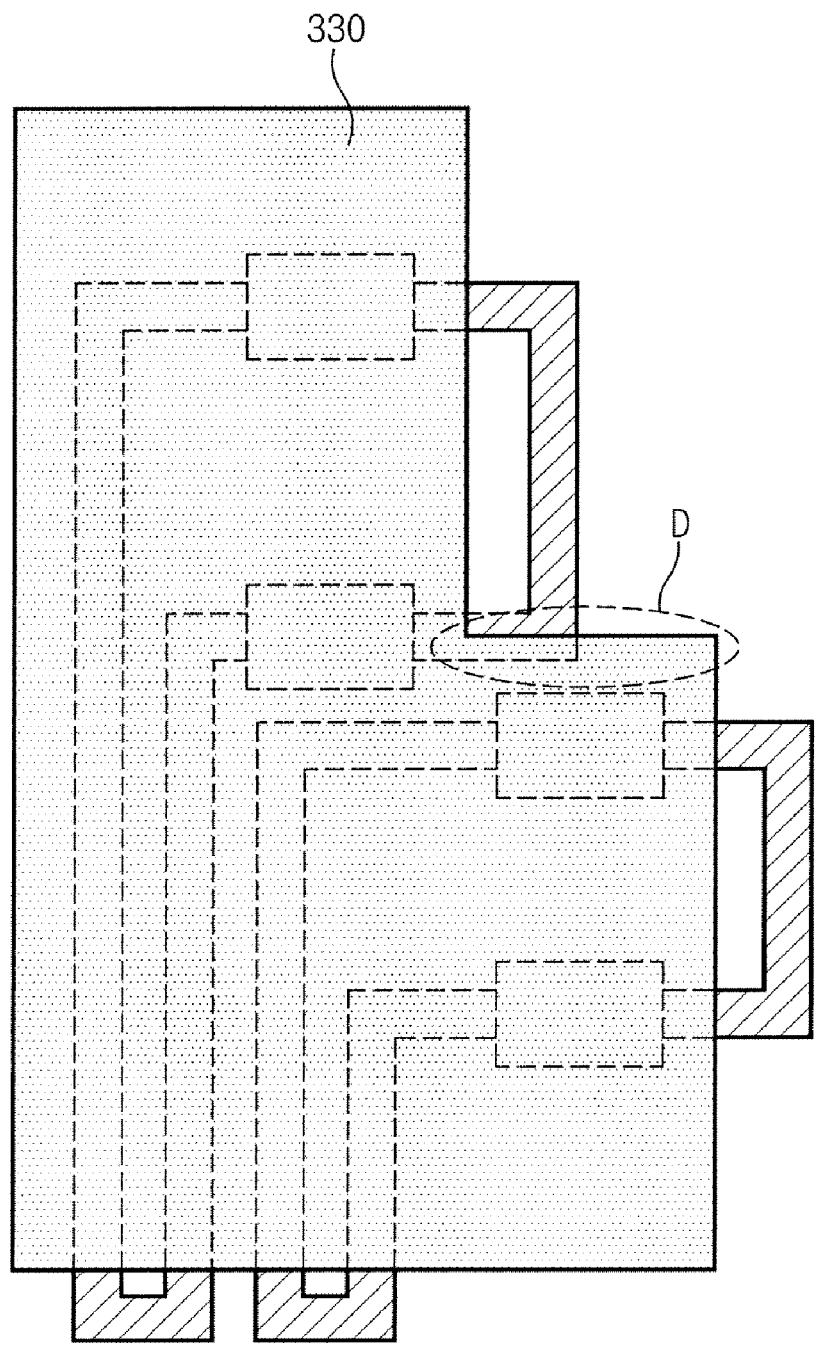
Figure 4E:
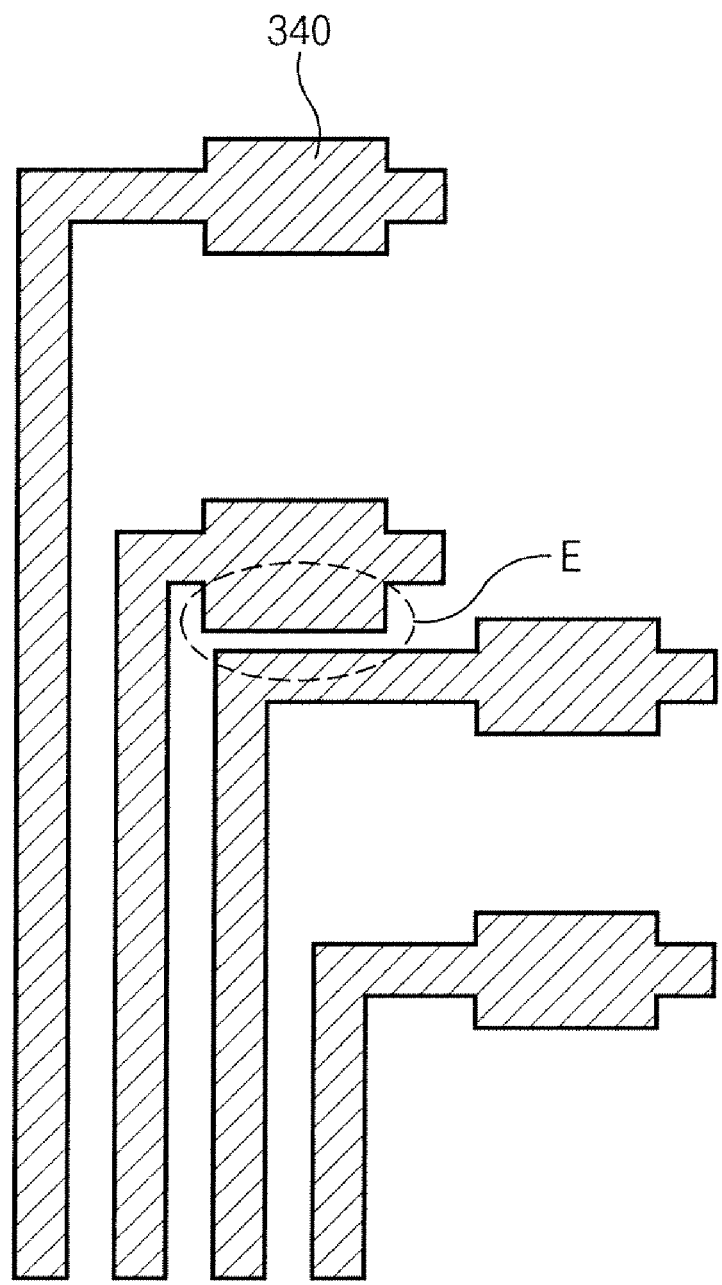

When a problem is generated in the CD or the overlap margin of the second pattern 220a of FIG. 3b as shown in 'C' of FIG. 4c, the designed pattern layout is re-designed. When the respective CDs of the major axis and the minor axis of the second pattern and the overlap margin are within the previously designed acceptable error range, the third mask layout 230 is verified (S170).

The verification of the third mask layout (S170) includes examining the overlap margin among the first mask layout 210, the second mask layout 220, and the third mask layout 230. The third mask layout is prepared to remove the end portion of the connected spacer 310. The step S170 verifies whether the connected spacer 310 is accurately removed. That is, when the connected spacer is not completely opened as shown in 'D' of FIG. 4d, the designed pattern layout is re-designed.

However, when the overlap margin is within the acceptable error range, an image to be formed over a wafer is simulated with the first mask layout 210, the second mask layout 220 and the third mask layout 230 (S180).

The image of the simulated pattern is compared with the designed pattern layout designed in the step S100 (S190). As a comparison result, when the simulated pattern image is not identical with the designed pattern layout, or deviates from the previously designed acceptable error range, the process returns to the step S100, and the steps S100~S180 are repeated.

However, when the simulated pattern image is identical with the designed pattern layout, the first mask layout, the second mask layout, and the third mask layout become final layouts for the SPT process (S200).

A mask is fabricated with the final first mask layout, second mask layout, and third mask layout (S210).

The process of fabricating a mask with the mask layout may be performed in a manner similar to or identical to a conventional mask fabricating process.

As described above, the disclosed method for decomposing a designed pattern layout comprises: decomposing (preferably automatically) a designed pattern layout to obtain a plurality of mask layouts; identifying a problematic region through simulation of the mask layout; and feeding back the region to correct the designed pattern layout, thereby detecting and correcting problems in each process to reduce a process time.

The above embodiments of the disclosure are illustrative and not limitative. Various alternatives and equivalents are possible. The invention is not limited by the type of deposition, etching polishing, and patterning steps described herein, nor is the invention limited to any specific type of semiconductor device. For example, the disclosure may be implemented in a dynamic random access memory (DRAM) device or non volatile memory device. Other additions, subtractions, or modifications are intended to fall within the scope of the appended claims.

What is claimed is:

1. A method for fabricating an exposure mask, the method comprising:
   decomposing a designed pattern layout that includes a plurality of line patterns and pad patterns overlapped with the line patterns into a first mask layout having a first pattern defined between two neighboring line patterns and a connection portion connecting the two neighboring line patterns, a second mask layout having a second pattern that defines the pad pattern, and a third mask layout having a third pattern that opens the connection portion;
   verifying the first mask layout by comparing the first mask layout with the designed pattern layout;
   forming a spacer over a contour image formed with the first mask layout;
   verifying the spacer;
   verifying the second mask layout by verifying an overlay margin with the first mask layout;
   verifying the third mask-layout by verifying an overlay margin with the first and second mask layout;
   combining the first mask layout, the second mask layout, and the third mask layout to perform a simulation, by a computer, to obtain a simulated image;
   comparing the simulated image with the designed pattern layout,
   re-designing the first, second, or third mask layouts after verifying the first mask layout, the second mask layout, and the third mask layout until the simulated image is identical with the designed pattern layout and a final mask layout is formed; and, fabricating a mask using the final mask layout.

2. The method according to claim 1, further comprising combining the mask layouts to compare the combined mask layout with the designed pattern layout.

3. The method according to claim 1, comprising verifying the spacer by verifying the deposition thickness uniformity of the spacer.

4. The method according to claim 1, further comprising, after verifying the first mask layout, forming a contour image.

* * * * *